US009779816B2

(12) United States Patent
Goda et al.

(10) Patent No.: US 9,779,816 B2
(45) **Date of Patent: *Oct. 3, 2017**

(54) APPARATUS AND METHODS INCLUDING SOURCE GATES

(71) Applicant: Micron Technology, Inc., Boise, ID (US)

(72) Inventors: Akira Goda, Boise, ID (US); Shafqat Ahmed, San Jose, CA (US); Khaled Hasnat, San Jose, CA (US); Krishna K. Parat, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/166,029

(22) Filed: May 26, 2016

(65) Prior Publication Data

US 2016/0343438 A1 Nov. 24, 2016

Related U.S. Application Data

(63) Continuation of application No. 14/451,145, filed on Aug. 4, 2014, now Pat. No. 9,378,839, which is a (Continued)

(51) Int. Cl.

*G11C 16/04* (2006.01)
*H01L 27/11519* (2017.01)

(Continued)

(52) U.S. Cl.

CPC ...... *G11C 16/0483* (2013.01); *G11C 16/0408* (2013.01); *G11C 16/06* (2013.01); *G11C 16/12* (2013.01); *G11C 16/14* (2013.01); *G11C 16/26* (2013.01); *G11C 16/3418* (2013.01); *G11C 16/3427* (2013.01); *H01L 27/11519* (2013.01);

(Continued)

(58) Field of Classification Search

CPC .......... G11C 16/08; G11C 16/10; G11C 16/16
USPC ............ 365/185.11, 185.17, 185.19, 185.23, 365/185.25

See application file for complete search history.

(56) References Cited

U.S. PATENT DOCUMENTS 5,615,152 A 3/1997 Bergemont
5,835,396 A 11/1998 Zhang (Continued)

FOREIGN PATENT DOCUMENTS

CN 101681677 A 3/2010
CN 103782344 A 6/2014

(Continued)

OTHER PUBLICATIONS

"U.S. Appl. No. 13/564,458, Response dated May 26, 2016 to Non Final Office Action dated Feb. 26, 2016", 8 pgs.

(Continued)

*Primary Examiner* — Connie Yoha

(74) *Attorney, Agent, or Firm* — Schwegman Lundberg & Woessner, P.A.

(57) ABSTRACT

Apparatus and methods are disclosed, such as an apparatus that includes a string of charge storage devices associated with a pillar (e.g., of semiconductor material), a source gate device, and a source select device coupled between the source gate device and the string. Additional apparatus and methods are described.

20 Claims, 7 Drawing Sheets

Related U.S. Application Data continuation of application No. 13/210,194, filed on Aug. 15, 2011, now Pat. No. 8,797,806.

(51) Int. Cl.

| | |
|---|---|
| ***H01L 27/11556*** | (2017.01) |
| ***H01L 27/11565*** | (2017.01) |
| ***H01L 27/11582*** | (2017.01) |
| ***G11C 16/26*** | (2006.01) |
| ***G11C 16/34*** | (2006.01) |
| ***G11C 16/12*** | (2006.01) |
| ***G11C 16/14*** | (2006.01) |
| ***G11C 16/06*** | (2006.01) |
| *G11C 16/10* | (2006.01) |

(52) U.S. Cl.

CPC .. *H01L 27/11556* (2013.01); *H01L 27/11565* (2013.01); *H01L 27/11582* (2013.01); *G11C 16/10* (2013.01)

(56) References Cited

U.S. PATENT DOCUMENTS

| | | | | |
|---|---|---|---|---|
| 5,969,990 | A | 10/1999 | Arase | |
| 6,154,391 | A | 11/2000 | Takeuchi et al. | |
| 6,272,044 | B2 | 8/2001 | Yamamoto et al. | |
| 6,307,781 | B1 | 10/2001 | Shum | |
| 6,870,769 | B1 | 3/2005 | Ha | |
| 7,023,739 | B2 | 4/2006 | Chen et al. | |
| 7,196,930 | B2 | 3/2007 | Han et al. | |
| 7,259,991 | B2 | 8/2007 | Aritome | |
| 7,433,231 | B2 | 10/2008 | Aritome | |
| 7,433,233 | B2 | 10/2008 | Chen et al. | |
| 7,440,321 | B2 | 10/2008 | Aritome | |
| 7,599,228 | B1 | 10/2009 | Lu et al. | |
| 7,626,866 | B2 | 12/2009 | Aritome et al. | |
| 7,940,564 | B2 | 5/2011 | Park et al. | |
| 8,004,885 | B2 | 8/2011 | Yun et al. | |
| 8,213,235 | B2 | 7/2012 | Kim | |
| 8,237,213 | B2 | 8/2012 | Liu | |
| 8,542,533 | B2 | 9/2013 | Maejima et al. | |
| 8,599,614 | B2 | 12/2013 | Miida et al. | |
| 8,797,806 | B2 * | 8/2014 | Goda ................ | H01L 27/11519 365/185.23 |
| 9,318,199 | B2 | 4/2016 | Abraham et al. | |
| 9,378,839 | B2 * | 6/2016 | Goda ................ | H01L 27/11519 |
| 9,653,171 | B2 | 5/2017 | Abraham et al. | |
| 2002/0088976 | A1 | 7/2002 | Shin et al. | |
| 2005/0128807 | A1 | 6/2005 | Chen et al. | |
| 2005/0232012 | A1 * | 10/2005 | Park .................. | G11C 16/0483 365/185.17 |
| 2006/0245263 | A1 | 11/2006 | Sakui | |
| 2006/0261404 | A1 | 11/2006 | Forbes | |
| 2007/0252201 | A1 | 11/2007 | Kito et al. | |
| 2008/0219053 | A1 | 9/2008 | Kim | |
| 2009/0180324 | A1 | 7/2009 | Ramaswamy et al. | |
| 2009/0230454 | A1 | 9/2009 | Pekny | |
| 2010/0172179 | A1 | 7/2010 | Gorobets | |
| 2010/0207194 | A1 | 8/2010 | Tanaka et al. | |
| 2010/0238732 | A1 | 9/2010 | Hishida et al. | |
| 2010/0257308 | A1 | 10/2010 | Hsu et al. | |
| 2010/0309729 | A1 | 12/2010 | Chang et al. | |
| 2010/0322000 | A1 | 12/2010 | Shim et al. | |
| 2011/0049607 | A1 | 3/2011 | Yahashi | |
| 2011/0051512 | A1 | 3/2011 | Violette | |
| 2011/0141788 | A1 | 6/2011 | Balakrishnan et al. | |
| 2011/0194357 | A1 | 8/2011 | Han et al. | |
| 2011/0249503 | A1 * | 10/2011 | Yamada ............. | G11C 16/0483 365/185.19 |
| 2011/0298011 | A1 | 12/2011 | Lee et al. | |
| 2011/0299314 | A1 | 12/2011 | Samachisa et al. | |
| 2012/0081957 | A1 | 4/2012 | Kim et al. | |
| 2012/0320678 | A1 | 12/2012 | Maejima et al. | |
| 2013/0044549 | A1 | 2/2013 | Goda | |
| 2013/0272067 | A1 | 10/2013 | Lee et al. | |
| 2014/0036590 | A1 | 2/2014 | Feeley et al. | |
| 2014/0043915 | A1 * | 2/2014 | Choi ...................... | G11C 16/10 365/185.25 |
| 2014/0122773 | A1 | 5/2014 | Abraham et al. | |
| 2014/0340963 | A1 | 11/2014 | Goda et al. | |
| 2016/0019970 | A1 * | 1/2016 | Sakui ................. | G11C 16/3427 365/185.25 |

FOREIGN PATENT DOCUMENTS

| | | | |
|---|---|---|---|
| CN | 104903964 | A | 9/2015 |
| EP | 2912665 | A1 | 9/2015 |
| JP | 2001135100 | A | 5/2001 |
| JP | 2002231835 | A | 8/2002 |
| JP | 2002245786 | A | 8/2002 |
| JP | 2004326864 | A | 11/2004 |
| JP | 2010192569 | A | 9/2010 |
| JP | 2011016530 | A | 1/2011 |
| KR | 1020110132820 | A | 12/2011 |
| TW | 200849261 | A | 12/2008 |
| TW | 201126531 | A | 8/2011 |
| TW | 201145300 | A | 12/2011 |
| TW | 201209827 | A | 3/2012 |
| WO | WO-2007005891 | A2 | 1/2007 |
| WO | WO-2011019794 | A2 | 2/2011 |
| WO | WO-2013025710 | A1 | 2/2013 |
| WO | WO-2014066829 | A1 | 5/2014 |

OTHER PUBLICATIONS

"U.S. Appl. No. 15/131,719, Non Final Office Action dated Jun. 15, 2016", 16 pgs.

"European Application Serial No. 12824349.0, Communication pursuant to Rules 70(2) and 70a(2) EPC dated Feb. 11, 2016", 1 pg.

"European Application Serial No. 12824349.0, Extended European Search Report dated Jan. 25, 2016", 6 pgs.

"European Application Serial No. 13848265.8, Extended European Search Report dated Jun. 1, 2016", 7 pgs.

"Chinese Application Serial No. 201280043709.9 Response dated Feb. 15, 2015 to Office Action dated Nov. 4, 2014", With the English claims, 14 pgs.

"Chinese Application Serial No. 201280043709.9, Amendment dated Aug. 8, 2014", W/ English Translation, 14 pgs.

"Chinese Application Serial No. 201280043709.9, Office Action dated Nov. 4, 2014", W/ English Translation, 8 pgs.

"European Application Serial No. 12824349.0, Office Action dated Mar. 26, 2014", 3 pgs.

"European Application Serial No. 12824349.0, Response dated Oct. 6, 2014 to Office Action dated Mar. 26, 2014", 30 pgs.

"European Application Serial No. 13848265.8, Response dated Dec. 16, 2015", 4 pgs.

"International Application Serial No. PCT/US2012/050783, International Preliminary Report on Patentability dated Feb. 27, 2014", 7 pgs.

"International Application Serial No. PCT/US2012/050783, International Search Report dated Dec. 17, 2012", 3 pgs.

"International Application Serial No. PCT/US2012/050783, Written Opinion dated Dec. 17, 2012", 5 pgs.

"International Application Serial No. PCT/US2013/066931, International Preliminary Report on Patentability dated May 7, 2015", 9 pgs.

"International Application Serial No. PCT/US2013/066931, International Search Report dated Feb. 10, 2014", 3 pgs.

"International Application Serial No. PCT/US2013/066931, Written Opinion dated Feb. 10, 2014", 7 pgs.

"Japanese Application Serial No. 2014-526130, Office Action dated Aug. 18, 2015", with English translation of claims, 11 pgs.

"Japanese ApplicationSerial No. 2014-526130, Response dated Nov. 18, 2015", with English translation of claims, 14 pgs.

Jang, J., et al., "Vertical cell array using TCAT(Terabit Cell Array Transistor) technology for ultra high density NAND flash memory", Symposium on VLSI Technology, (2009), 192-193.

(56) References Cited

OTHER PUBLICATIONS

"U.S. Appl. No. 15/131,719, Amendment Under 37 C.F.R. dated Apr. 4, 2017", 8 pgs.
"U.S. Appl. No. 15/131,719, Notice of Allowance dated Jan. 4, 2017", 7 pgs.
"U.S. Appl. No. 15/131,719, PTO Response to Rule 312 Communication dated Apr. 13, 2017", 2 pgs.
"U.S. Appl. No. 15/131,719, Response dated Oct. 14, 2016 to Non Final Office Action dated Jun. 15, 2016", 13 pgs.
"Chinese Application Serial No. 201380062847.6, Office Action dated Apr. 27, 2017", w/ English Translation, 26 pgs.
"European Application Serial No. 13848265.8, Response dated Dec. 28, 2016 to Extended European Search Report dated Jun. 1, 2016", 15 pgs.
"Japanese Application Serial No. 2015-539863, Office Action dated Feb. 7, 2017", w/ English Translation, 8 pgs.
"Japanese Application Serial No. 2015539863, Response dated Mar. 8, 2017 to Office Action dated Feb. 7, 2017", w/ English Claims, 16 pgs.
"Taiwanese Application Serial No. 102138824, Office Action dated Nov. 28, 2016", w/ English Translation, 7 pgs.
"Taiwanese Application Serial No. 102138824, Response dated Mar. 1, 2017 to Office Action dated Nov. 28, 2017", w/English Translation, 39 pgs.

* cited by examiner

APPARATUS AND METHODS INCLUDING SOURCE GATES

PRIORITY APPLICATION

This application is a continuation of U.S. application Ser. No. 14/451,145, filed Aug. 4, 2014, now issued as U.S. Pat. No. 9,378,839, which is a continuation of U.S. application Ser. No. 13/210,194, filed Aug. 15, 2011, now issued as U.S. Pat. No. 8,797,806, all of which are incorporated herein by reference in their entirety.

BACKGROUND

Semiconductor memory devices are used in many electronic devices such as personal digital assistants (PDAs), laptop computers, mobile phones and digital cameras. Some of these semiconductor memory devices have arrays of charge storage transistors.

BRIEF DESCRIPTION OF THE DRAWINGS

Some embodiments are illustrated by way of example and not limitation in the figures of the accompanying drawings in which.

DETAILED DESCRIPTION

An array of charge storage devices according to various embodiments of the invention may function as an array of memory cells in a memory device such as a NOT AND (NAND) memory device.

For the purposes of this document, a "tier of semiconductor material" can mean semiconductor material formed in a same plane, rank, row, or unit, such as in a horizontal or vertical or sloped plane, row, rank or unit of a structure. Meanwhile, an "apparatus" can refer to circuitry, devices or systems.

Figure 1A:
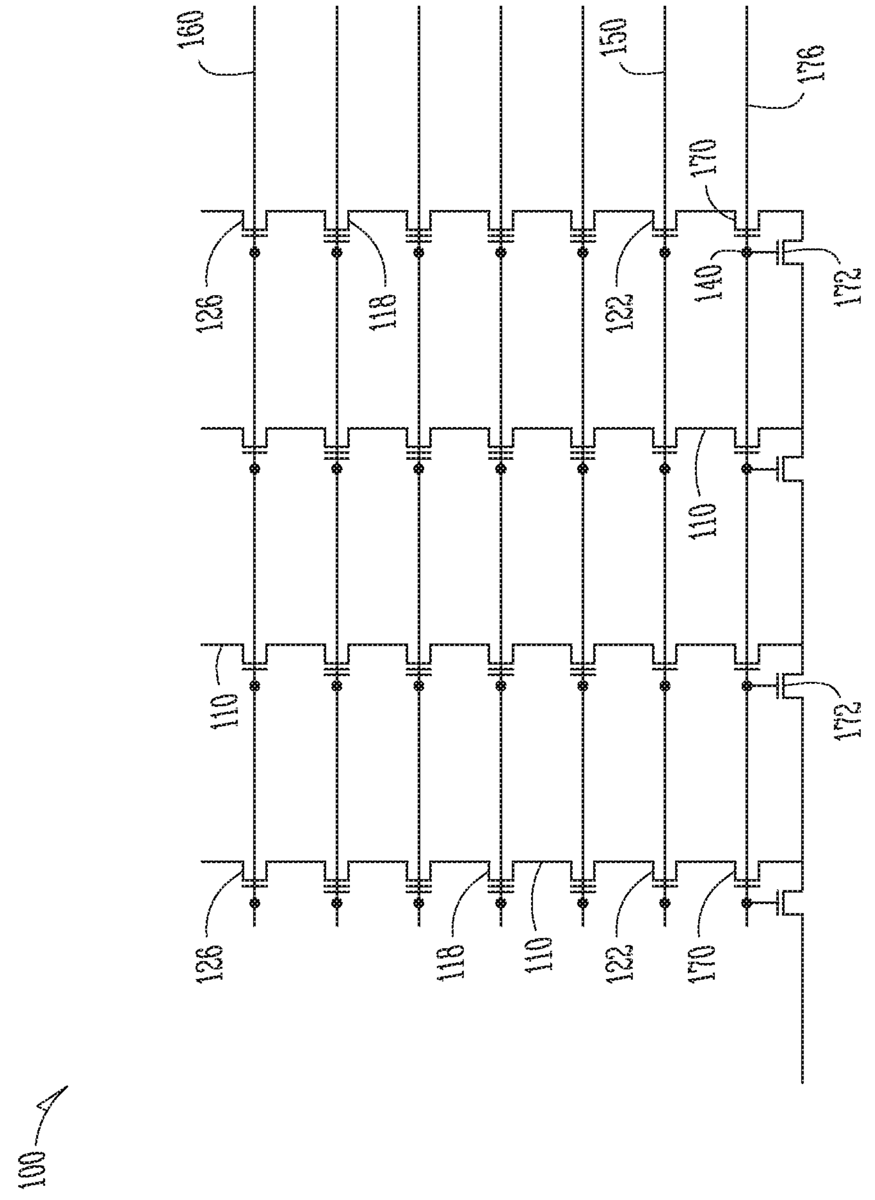
FIGS. 1A and 1B are electrical schematic diagrams of a block of memory cells according to various embodiments of the invention.
Figure 1B:
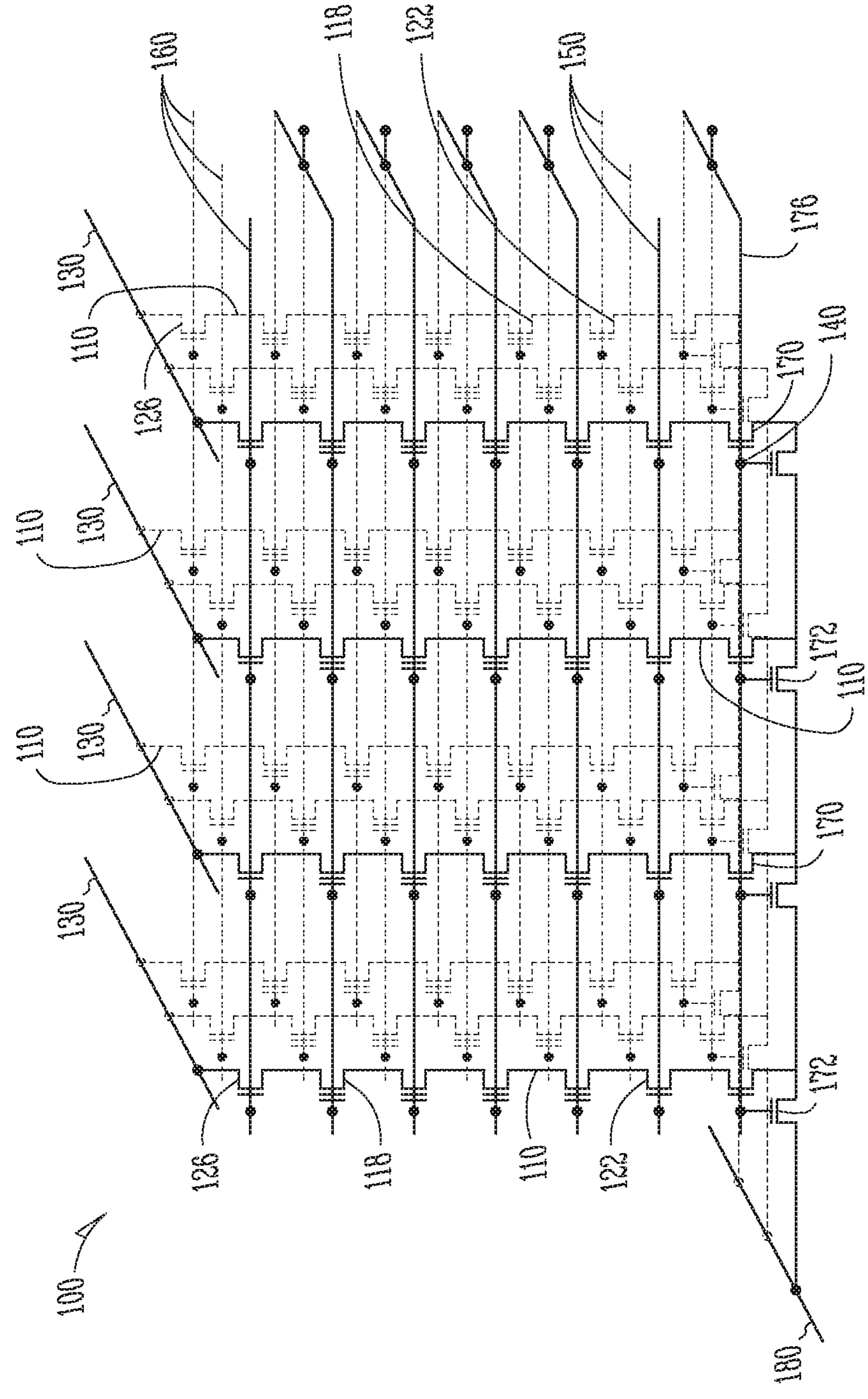

FIGS. 1A and 1B are electrical schematic diagrams of a block 100 of memory cells according to various embodiments of the invention. The block 100 includes strings 110 of charge storage devices 118. A single NAND memory device may include multiple strings.

The strings 110 are arranged in rows and columns in the block 100. FIG. 1A shows a single row of four strings 110 aligned with one vertical plane of the block 100 of memory cells. FIG. 1B shows three rows each having four strings 110 (for a total of twelve strings 110). Each string 110 includes four charge storage devices 118 coupled serially, although each string 110 may include fewer or more charge storage devices 118. Each string 110 includes a source select device 122 at a bottom of the string 110 and a drain select device 126 at a top of the string 110.

The drain select device 126 is coupled between the charge storage devices 118 and a data line 130. There are four data lines 130 that are coupled to the strings 110, each data line 130 being coupled to three of the strings 110 in a column of the block 100. The source select device 122 is coupled between the charge storage devices 118 and a source gate 140.

The source select device 122 has a source select gate (SGS) coupled to a SGS line 150. There are three SGS lines 150 that are coupled to the source select devices 122 in the block 100, each SGS line 150 being coupled to gates of four of the source select devices 122 in a row of the block 100. The SGS lines 150 are substantially orthogonal to the data lines 130.

The drain select device 126 has a drain select gate (SGD) coupled to a SGD line 160. There are three SGD lines 160 that are coupled to the drain select devices 126 in the block 100, each SGD line 160 being coupled to gates of four of the drain select devices 126 in a row of the block 100. The SGD lines 160 are substantially orthogonal to the data lines 130. The source gate 140 substantially controls conduction in a first channel in the string 110 represented by a first source gate device 170 and a second channel in a substrate (not shown) represented by a second source gate device 172. The source gates 140 of all of the strings 110 in the block 100 are coupled to a single source gate line 176. The second source gate devices 172 in each row of the block 100 are coupled in series between the respective strings 110 and a common source line 180.

Each of the charge storage devices 118 may comprise a transistor having a charge trap or a floating gate, for example. Each charge storage device 118 may comprise a multi-state device capable of holding multiple separate and distinct threshold voltage states (e.g., corresponding to respective ranges of threshold voltages), each threshold voltage state representing different data. Each of the source select device 122 and the drain select device 126 may comprise a transistor.

Figure 2:
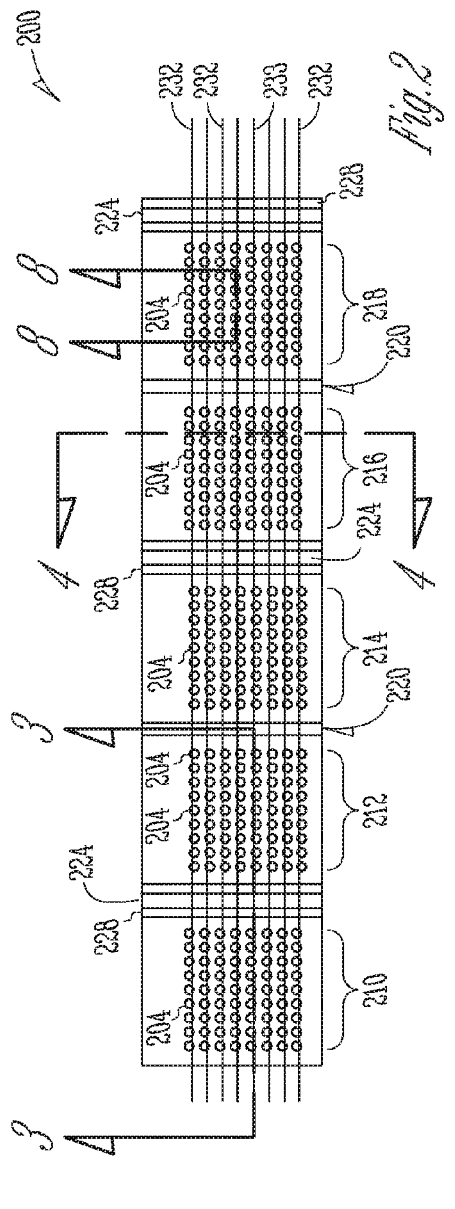
FIG. 2 is a top view of a semiconductor construction according to various embodiments of the invention.

FIG. 2 is a top view of a semiconductor construction 200 according to various embodiments of the invention. The semiconductor construction 200 includes three-hundred and sixty pillars 204 comprising a semiconductor material. For example, the pillars 204 may comprise polysilicon. Each of the pillars 204 provides a channel for multiple charge storage devices in a string in a NAND memory device.

The pillars 204 are arranged into eight rows of forty five columns with each pillar 204 occupying an intersection of a row and a column. The pillars 204 are divided into five blocks 210, 212, 214, 216 and 218 separated from each other by either empty space 220 or a conductive member (e.g., a conductive slot) 224 coupled to an n+ type diffusion region 228. The empty space 220 and space around the members 224 are filled with a dielectric (not shown) such as, for example, silicon dioxide ($SiO_2$). Each of the blocks 210, 212, 214, 216 and 218 includes seventy two of the pillars 204 in eight rows of nine columns. The pillars 204 in each row across all of the blocks 210, 212, 214, 216 and 218 are coupled together by a data line 232 or 233 that may be used to sense a state of one of the charge storage devices in the row. The data lines 232 and 233 may comprise, for example, polysilicon or metal, including one or more of cobalt (Co), titanium (Ti), tungsten (W), nickel (Ni) or tantalum (Ta) according to various embodiments of the invention. The semiconductor construction 200 can include different numbers of pillars 204 arranged in different numbers of rows and columns in different numbers of blocks according to various embodiments of the invention.

Figure 4:
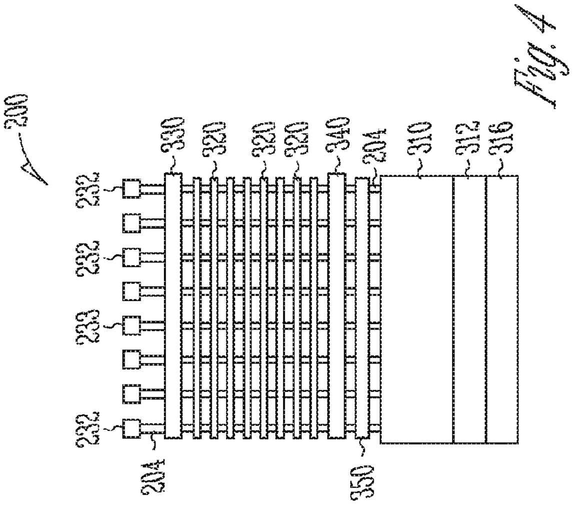
FIG. 4 is a cross-sectional view of a semiconductor construction according to various embodiments of the invention.
Figure 3:
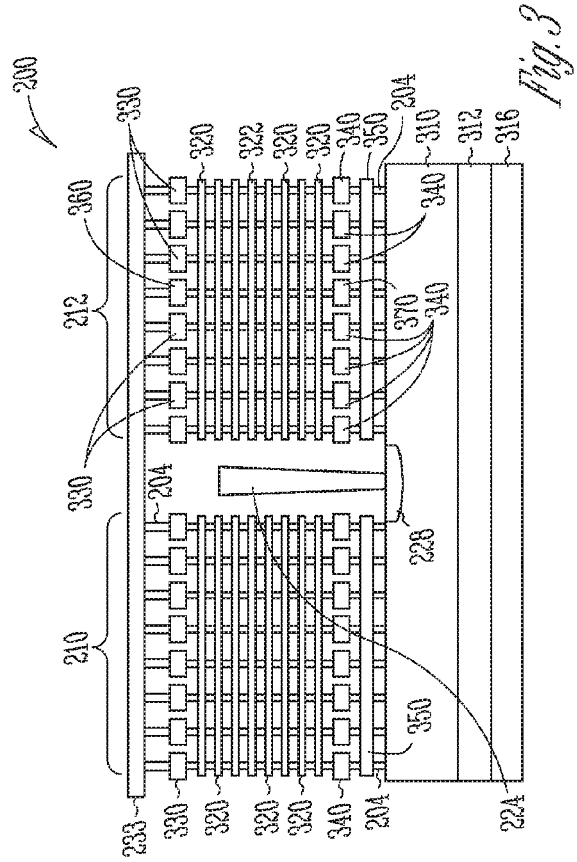
FIG. 3 is a cross-sectional view of a semiconductor construction according to various embodiments of the invention.

FIG. 3 is a cross-sectional view of the semiconductor construction 200 along line 3-3 according to various embodiments of the invention and FIG. 4 is a cross-sectional view of the semiconductor construction 200 along line 4-4 according to various embodiments of the invention. FIG. 3 illustrates the pillars 204 in blocks 210 and 212 and one of the members 224 between the blocks 210 and 212. FIG. 4 illustrates the pillars 204 in the block 216.

The pillars 204 extend from the data lines 232 and 233 to a p-type silicon well 310. The silicon well 310 is formed in an n-type silicon well 312 which is formed in a p-type silicon substrate 316. The n+ type diffusion region 228 is formed in the silicon well 310 and can reduce resistance to current flow in the silicon well 310. A number of tiers of metal or semiconductor material surround or partially surround the pillars 204 between the data lines 232 and 233 and the silicon well 310 in each of the blocks 210, 212, 214, 216 and 218. The tiers are separated from each other by a dielectric (not shown) such as, for example, silicon dioxide ($SiO_2$). A majority of the tiers are access lines 320 and 322 to control the charge storage devices that receive and release charge through the pillars 204. Each of the access lines 320 and 322 surrounds or partially surrounds all of the pillars 204 in a block such as the blocks 210 and 212 shown in FIG. 3.

A tier between the access lines 320 and 322 and the data lines 232 and 233 is divided into drain select gates (SGDs) 330 and 360 that may substantially control conduction between the pillars 204 and the data lines 232 and 233. The eight pillars 204 in each column are surrounded or partially surrounded by a separate SGD 330 or 360. A tier below the access lines 320 and 322 is divided into source select gates (SGSs) 340 and 370 that may at least partially control conduction between the pillars 204 and the silicon well 310. The eight pillars 204 in each column are surrounded or partially surrounded by a separate SGS 340 or 370.

A tier between the SGSs 340 and 370 and the silicon well 310 comprises a source gate 350. In the embodiment depicted in FIGS. 2-4, source gate 350 surrounds or partially surrounds all of the pillars 204 in a block such as the block 210 or the block 212 shown in FIG. 3. The source gate 350 may at least partially control conduction between the pillars 204 and the silicon well 310.

The members 224 each comprise a conductive structure, such as one having a wall shape, coupled to the n+ type diffusion region 228 in the silicon well 310, and that projects from the substrate 316. The members 224 comprise, for example, a semiconductor such as polysilicon or a metal such as tungsten. Each member 224 and the n+ type diffusion region 228 coupled to the member 224 can be used as a common source line in the semiconductor construction 200. The members 224 can be used to bias the silicon well 310 to a potential as desired. The members 224 can also reduce the resistance to current flow in the silicon well 310.

The access lines 320 and 322, the SGDs 330 and 360, the SGSs 340 and 370 and the source gate 350 can be separated from each other by a dielectric such as, for example, silicon dioxide ($SiO_2$). The access lines 320 and 322, the SGDs 330 and 360, the SGSs 340 and 370 and the source gate 350 may comprise tiers of a semiconductor material such as silicon or polysilicon or polysilicon doped with Phosphorous or Boron. The access lines 320 and 322, the SGDs 330 and 360, the SGSs 340 and 370 and the source gate 350 may also comprise metal including one or more of Cobalt (Co), Titanium (Ti), Tungsten (W), Nickel (Ni) or Tantalum (Ta) according to various embodiments of the invention.

The access lines 320 and 322 control charge storage devices surrounding or partially surrounding each pillar 204. Each charge storage device may comprise, for example, a floating gate transistor or a charge trap transistor. The SGDs 330 and 360, the SGSs 340 and 370 and the source gate 350 control transistors surrounding or partially surrounding each pillar 204.

Operations involving charge storage devices in the semiconductor construction 200 will be described with reference to a selected charge storage device having a channel in a selected pillar 204 between the SGD 360 and the SGS 370 in the block 212. The selected pillar 204 is coupled to the data line 233. The selected charge storage device is controlled by the access line 322.

The selected charge storage device is read when the voltages shown in Table 1 are applied to the semiconductor construction 200.

TABLE 1

| | Block 212 | Block 210 |
|---|---|---|
| Data line 233 | ~0.3 V | ~0.3 V |
| Data lines 232 | ~0 V | ~0 V |
| Access line 322 | 0 to ~3 V | ~0 V |
| Access lines 320 | ~6 V | ~0 V |
| SGD 360 | ~4 V | N/A |
| SGDs 330 | ~0 V | ~0 V |
| SGS 370 | ~4 V | N/A |
| SGSs 340 | ~0 V | ~0 V |
| Source gate 350 | ~5 V | ~0 V |
| Member 224 | ~0 V | ~0 V |
| Silicon Well 310 | ~0 V | ~0 V |

Approximately 4 volts is applied to turn on the SGD 360 and the SGS 370 and approximately 5 volts is applied to turn on the source gate 350 in the block 212 to couple the selected pillar 204 to the data line 233 and the silicon well 310. A channel develops in the silicon well 310 under the block 212 due to the potential of the source gate 350 to carry charge from the block 212 to the member 224 and the n+ type diffusion region 228 coupled to the member 224 that can be a common source line. The access line 322 in the block 212 is coupled to between approximately 0 volts and approximately 3 volts in stages to gradually turn on the selected charge storage device, which can be in one of a plurality of charge storage states. Approximately 6 volts are applied to the other access lines 320 in the block 212 to render the other charge storage devices associated with the selected pillar 204 conductive. The other SGDs 330 and SGSs 340 in the block 212 are coupled to approximately 0 volts and are not conductive, such that the channel does not receive charge from the pillars 204 other than the selected pillar 204. The data line 233 is precharged to approximately 0.3 volts to allow the selected charge storage device to be read, and the other data lines 232 are at approximately 0 volts. The access lines 320, the SGDs 330, the SGSs 340 and the source gate 350 in the block 210 are at approximately 0 volts. The data lines 232 and 233 and the silicon well 310 are at the same potential for the blocks 210 and 212.

Charge storage devices associated with pillars other than the selected pillar 204 can be influenced during a read by the access lines 320 at approximately 6 volts, and may be programmed unintentionally. This unintentional programming is called read disturb. The inventors have discovered that the challenge noted above, as well as others, can be addressed by turning on the source gate 350 at 5 volts to allow the SGSs 340 of the pillars other than the selected pillar 204 to be turned off to substantially electrically isolate the pillars other than the selected pillar 204 from the silicon well 310. The SGSs 340 that are not conductive substantially prevent conduction between the pillars other than the selected pillar 204 and the silicon well 310 to substantially prevent read disturb activity with respect to those pillars 204.

The selected charge storage device is programmed when the voltages shown in Table 2 are applied to the semiconductor construction 200.

TABLE 2

| | Block 212 | Block 210 |
|---|---|---|
| Data line 233 | 0 to ~1 V | 0 to ~1 V |
| Data lines 232 | ~2.3 V | ~2.3 V |
| Access line 322 | ~20 V | ~0 V |
| Access lines 320 | ~10 V | ~0 V |
| SGD 360 | ~3 V | N/A |
| SGDs 330 | ~0 V | ~0 V |
| SGS 370 | 0 to ~3 V | N/A |
| SGSs 340 | 0 to ~3 V | ~0 V |
| Source gate 350 | ~0 V | ~0 V |
| Member 224 | 0 to ~2 V | 0 to ~2 V |
| Silicon Well 310 | ~0 V | ~0 V |

Approximately 3 volts is applied to turn on the SGD 360. The SGSs 340 and 370 in the block 212 are biased to between approximately 0 and approximately 3 volts and the member 224 is biased to between approximately 0 and approximately 2 volts. The SGDs 330 and the source gate 350 in the block 212 and the silicon well 310 are biased to approximately 0 volts. Approximately 20 volts are applied to the access line 322 in the block 212 to turn on the selected charge storage device to program it. Approximately 10 volts are applied to the other access lines 320 in the block 212 to render the other charge storage devices associated with the selected pillar 204 conductive. The SGDs 330 that are biased to approximately 0 volts are not conductive such that the pillars in the block 212 other than the selected pillar 204 are floating and have a potential that rises to approximately 8 volts due to the potential on the access lines 320 of approximately 10 volts to substantially prevent programming. The data line 233 coupled to the selected pillar 204 is between approximately 0 and approximately 1 volt to allow the selected charge storage device to be programmed and the other data lines 232 are biased to approximately 2.3 volts. The access lines 320, the SGDs 330, the SGSs 340 and the source gate 350 in the block 210 are at approximately 0 volts. The data lines 232 and 233 and the silicon well 310 are at the same potential for the blocks 210 and 212.

The source gate 350 is switched off to substantially reduce leakage of current to the n+ type diffusion region 228 and the member 224 and this can reduce program disturb activity during programming operations. The voltage applied to the SGSs 340 and 370 can be higher than the approximately 3 volts to reduce an electromagnetic field between the SGSs 340 and 370 and the access lines 320 and 322.

The selected charge storage device is erased when the voltages shown in Table 3 are applied to the semiconductor construction 200.

TABLE 3

| | Block 212 | Block 210 |
|---|---|---|
| Data lines 232, 233 | ~20 V | ~20 V |
| Access lines 320, 322 | ~0 V | ~20 V |
| SGDs 330, 360 | ~20 V | ~20 V |
| SGSs 340, 370 | ~20 V | ~20 V |
| Source gate 350 | ~20 V | ~20 V |
| Member 224 | ~20 V | ~20 V |
| Silicon Well 310 | ~20 V | ~20 V |

Approximately 20 volts is applied to the silicon well 310 such that the potential on the pillars 204 rises to approximately 20 volts. The SGSs 340 and 370, the member 224, the source gate 350, the SGDs 330 and 360 and the data lines 232 and 233 are left floating and rise to approximately 20 volts from capacitive coupling with the pillars 204. Approximately 0 volts are applied to the access lines 320 and 322 in the block 212 to erase the charge storage devices associated with the pillar 204 above the SGS 370. The access lines 320 in the block 210 are also left floating and rise to approximately 20 volts from capacitive coupling with the pillars 204.

Figure 5:
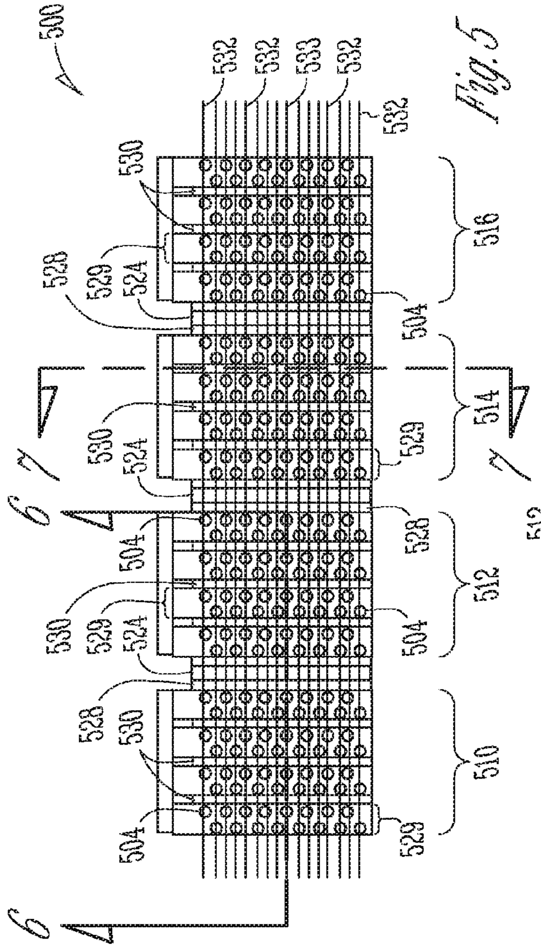
FIG. 5 is a top view of a semiconductor construction according to various embodiments of the invention.

FIG. 5 is a top view of a semiconductor construction 500 according to various embodiments of the invention. The semiconductor construction 500 includes two-hundred and fifty-six pillars 504 comprising a semiconductor material. For example, the pillars 504 may comprise polysilicon. Each of the pillars 504 provides a channel for multiple charge storage devices in a string in a NAND memory device.

The pillars 504 are divided into four blocks 510, 512, 514 and 516 separated from each other by a conductive member 524 coupled to an n+ type diffusion region 528. Each of the blocks 510, 512, 514 and 516 includes 64 of the pillars 504 separated into sub-blocks 529, each sub-block 529 including 16 of the pillars 504. Each sub-block 529 is separated from neighboring sub-blocks 529 in the same block by an n+ type diffusion region 530. Sixteen data lines 532 and 533 are coupled to tops of the pillars 504, and the pillars 504 are arranged in two staggered columns in each sub-block 529. The columns of the pillars 504 are substantially perpendicular to the data lines 532 and 533 such that each data line 532 and 533 is coupled to a top of only one of the pillars 504 in each sub-block 529 of the semiconductor construction 500. Each data line 532 and 533 may be used to sense a state of one of the charge storage devices in one of the sub-blocks 529. The data lines 532 and 533 may comprise, for example, polysilicon or metal, including one or more of cobalt (Co), titanium (Ti), tungsten (W), nickel (Ni) or tantalum (Ta), according to various embodiments of the invention.

Figure 7:
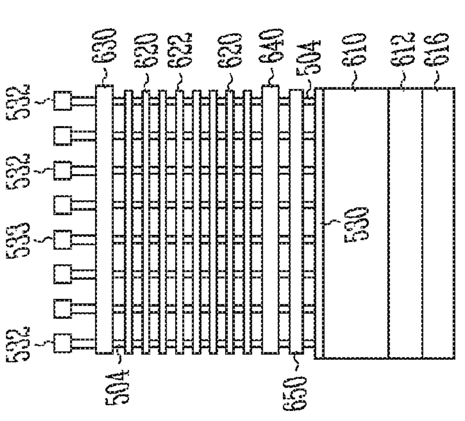
FIG. 7 is a cross-sectional view of a semiconductor construction according to various embodiments of the invention.
Figure 6:
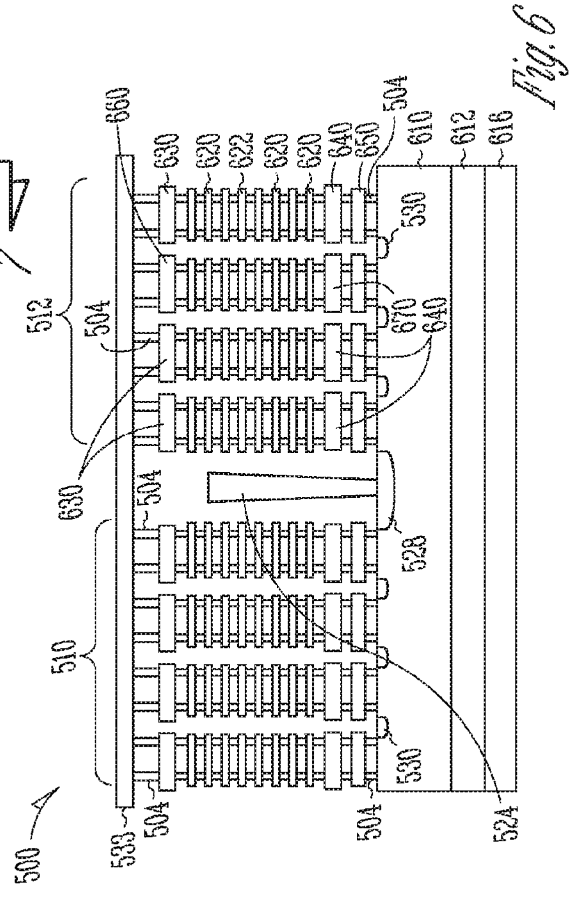
FIG. 6 is a cross-sectional view of a semiconductor construction according to various embodiments of the invention.

FIG. 6 is a cross-sectional view of the semiconductor construction 500 along line 6-6 according to various embodiments of the invention and FIG. 7 is a cross-sectional view of the semiconductor construction 500 along line 7-7 according to various embodiments of the invention. FIG. 6 shows the pillars 504 in the blocks 510 and 512 and one of the members 524 between the blocks 510 and 512. Half of the pillars 504 in the blocks 510 and 512 are shown in cross-section and half of the pillars 504 in the blocks 510 and 512 are not shown in cross-section but are staggered and behind the pillars 504 shown in cross-section. The pillars 504 that are staggered and behind the pillars 504 shown in cross-section are coupled to a data line 532 behind the data line 533 shown in FIG. 6. FIG. 7 shows eight of the pillars 504 and half of the data lines 532 and 533 in block 514 for purposes of brevity and clarity.

The pillars 504 extend from the data lines 532 and 533 to a p-type silicon well 610. The silicon well 610 is formed in an n-type silicon well 612 which is formed in a p-type silicon substrate 616. The n+ type diffusion regions 528 and 530 are formed in the silicon well 610 and can reduce resistance to current flow in the silicon well 610. A number of tiers of metal or semiconductor material surround or partially surround the pillars 504 between the data lines 532 and 533 and the silicon well 610 in each of the blocks 510, 512, 514 and 516. The tiers are separated from each other by a dielectric (not shown) such as, for example, silicon dioxide ($SiO_2$). A majority of the tiers comprise access lines 620 and 622 to control the charge storage devices that receive and release charge through the pillars 504. All of the pillars 504 in a sub-block 529 are surrounded or partially surrounded by respective access lines 620 or 622.

A tier between the access lines 620 and 622 and the data lines 532 and 533 is divided into SGDs 630 and 660 that may substantially control conduction between the pillars 504 and the data lines 532 and 533. The pillars 504 in each sub-block 529 are surrounded or partially surrounded by a separate SGD 630 or 660. A tier below the access lines 620 and 622 is divided into SGSs 640 and 670 that may at least partially control conduction between the pillars 504 and the silicon well 610. The pillars 504 in each sub-block 529 are surrounded or partially surrounded by a separate SGS 640 or 670. A tier between the SGSs 640 and 670 and the silicon well 610 is a source gate 650. The pillars 504 in each sub-block 529 are surrounded or partially surrounded by a separate source gate 650. The source gates 650 may also at least partially control conduction between the pillars 504 and the silicon well 610.

The members 524 each comprise a conductive structure, such as one having a wall shape, coupled to the n+ type diffusion region 528 in the silicon well 610, and that projects from the substrate 616. The members 524 comprise, for example, a semiconductor such as polysilicon or a metal such as tungsten. Each member 524 and the n+ type diffusion region 528 coupled to the member 524 can be used as a common source line in the semiconductor construction 500. The members 524 can be used to bias the silicon well 610 to a potential as desired. The members 524 can also reduce the resistance to current flow in the silicon well 610.

The access lines 620 and 622, the SGDs 630 and 660, the SGSs 640 and 670 and the source gate 650 can be separated from each other by a dielectric such as, for example, silicon dioxide ($SiO_2$). The access lines 620 and 622, the SGDs 630 and 660, the SGSs 640 and 670 and the source gate 650 may comprise tiers of a semiconductor material such as silicon or polysilicon or polysilicon doped with Phosphorous or Boron. The access lines 620 and 622, the SGDs 630 and 660, the SGSs 640 and 670 and the source gate 650 may also comprise metal including one or more of cobalt (Co), titanium (Ti), tungsten (W), nickel (Ni) or tantalum (Ta) according to various embodiments of the invention. The access lines 620 and 622 control charge storage devices associated with each pillar 504. The SGDs 630 and 660, the SGSs 640 and 670 and the source gate 650 control transistors surrounding or partially surrounding each pillar 504. Each charge storage device may comprise, for example, a floating gate transistor or a charge trap transistor.

Operations involving charge storage devices in the semiconductor construction 500 will be described with reference to a selected charge storage device having a channel in a selected pillar 504 between the SGD 660 and the SGS 670 in the block 512. The selected pillar 504 is coupled to the data line 533. The selected charge storage device is controlled by the access line 622.

The selected charge storage device is read when the voltages shown in Table 4 are applied to the semiconductor construction 500.

TABLE 4

| | Block 512 | Block 510 |
|---|---|---|
| Data line 533 | ~0.3 V | ~0.3 V |
| Data lines 532 | ~0 V | ~0 V |
| Access line 622 | 0 to ~3 V | ~0 V |
| Access lines 620 | ~6 V | ~0 V |
| SGD 660 | ~4 V | ~0 V |
| SGDs 630 | ~0 V | ~0 V |
| SGS 670 | ~4 V | ~0 V |
| SGSs 640 | ~0 V | ~0 V |
| Source gate 650 | ~5 V | ~0 V |
| Member 524 | ~0 V | ~0 V |
| Silicon Well 610 | ~0 V | ~0 V |

Approximately 4 volts is applied to turn on the SGD 660 and the SGS 670 and approximately 5 volts is applied to turn on the source gates 650 in the block 512 to couple the selected pillar 504 to the data line 533 and the silicon well 610. A channel develops in the silicon well 610 under the block 512 due to the potential of the source gate 650 to carry charge from the block 512 to the member 524 and the n+ type diffusion region 528 coupled to the member 524 that can be a common source line. The access line 622 in the block 512 is biased to a potential from approximately 0 to approximately 3 volts in stages to gradually turn on the selected charge storage device, which can be in one of a plurality of charge storage states. Approximately 6 volts are applied to the other access lines 620 in the block 512 and render the other charge storage devices associated with the selected pillar 504 conductive. The other SGDs 630 and SGSs 640 in the block 512 are biased to approximately 0 volts and are not conductive such that the channel does not receive charge from the pillars 504 other than the selected pillar 504. The data line 533 is precharged to approximately 0.3 volts to allow the selected charge storage device to be read, and the other data lines 532 are at approximately 0 volts. The access lines 620, the SGDs 630, the SGSs 640 and the source gate 650 in the block 510 are at approximately 0 volts. The data lines 532 and 533 and the silicon well 610 are at the same potential for the blocks 510 and 512. The pillar 504 that is between the SGD 660 and the SGS 670 that is not selected is not selected because it's coupled to one of the data lines 532 at approximately 0V.

The source gates 650 in the block 512 are turned on at 5 volts to allow the SGSs 640 of the pillars other than the selected pillar 504 to be turned off to substantially electrically isolate the pillars other than the selected pillar 504 from the silicon well 610. The SGSs 640 that are not conductive substantially prevent conduction between the pillars other than the selected pillar 504 and the silicon well 610 to substantially prevent read disturb in those pillars.

The selected charge storage device is programmed when the voltages shown in Table 5 are applied to the semiconductor construction 500.

TABLE 5

| | Block 512 | Block 510 |
|---|---|---|
| Data line 533 | 0 to ~1 V | 0 to ~1 V |
| Data lines 532 | ~2.3 V | ~2.3 V |
| Access line 622 | ~20 V | ~0 V |
| Access lines 620 | ~10 V | ~0 V |
| SGD 660 | ~3 V | N/A |
| SGDs 630 | ~0 V | ~0 V |
| SGS 670 | 0 to ~3 V | N/A |
| SGSs 640 | 0 to ~3 V | ~0 V |
| Source gate 650 | ~0 V | ~0 V |
| Member 524 | 0 to ~2 V | 0 to ~2 V |
| Silicon Well 610 | ~0 V | ~0 V |

Approximately 3 volts is applied to turn on the SGD 660 in the block 512. The SGSs 640 and 670 in the block 512 are biased to between approximately 0 and approximately 3 volts and the member 524 is biased to between 0 and approximately 2 volts. The SGDs 630 and the source gate 650 in the block 512 and the silicon well 610 are biased to approximately 0 volts. Approximately 20 volts are applied to the access line 622 in the block 512 to turn on the selected charge storage device to program it. Approximately 10 volts are applied to the other access lines 620 in the block 512 and render the other charge storage devices associated with the selected pillar 504 conductive. The SGDs 630 in the block 512 that are biased to approximately 0 volts are not conductive, such that the pillars other than the selected pillar 504 are floating and have a potential that rises to approximately 8 volts due to the potential on the access lines 620 of approximately 10 volts to substantially prevent programming. The data line 533 coupled to the selected pillar 504 is between approximately 0 volts and approximately 1 volt to allow the selected charge storage device to be programmed and the other data lines 532 are biased to approximately 2.3 volts. The access lines 620, the SGDs 630, the SGSs 640 and the source gate 650 in the block 510 are at approximately 0 volts. The data lines 532 and 533 and the silicon well 610 are at the same potential for the blocks 510 and 512.

The source gate 650 in the block 512 is switched off to substantially reduce leakage of current to the n+ type diffusion region 528 and the member 524 and this can reduce program disturb activity during the programming. The voltage applied to the SGSs 640 and 670 can be higher than the approximately 3 volts, such as to reduce an electromagnetic field between the SGSs 640 and 670 and the access lines 620 and 622.

The selected charge storage device is erased when the voltages shown in Table 6 are applied to the semiconductor construction 500.

TABLE 6

| | Block 512 | Block 510 |
|---|---|---|
| Data lines 532, 533 | ~20 V | ~20 V |
| Access lines 620, 622 | ~0 V | ~20 V |
| SGDs 630, 660 | ~20 V | ~20 V |
| SGSs 640, 670 | ~20 V | ~20 V |
| Source gate 650 | ~20 V | ~20 V |
| Member 524 | ~20 V | ~20 V |
| Silicon Well 610 | ~20 V | ~20 V |

Approximately 20 volts is applied to the silicon well 610 such that the potential on the pillars 504 rises to approximately 20 volts. The SGSs 640 and 670, the member 524, the source gate 650, the SGDs 630 and 660 and the data lines 532 and 533 are left floating and rise to approximately 20 volts from capacitive coupling with the pillars 504. Approximately 0 volts are applied to the access lines 620 and 622 in the block 512 to erase the charge storage devices associated with the pillar 504 above the SGS 670. The access lines 620 in the block 510 are left floating and rise to approximately 20 volts from capacitive coupling with the pillars 504.

Figure 8:
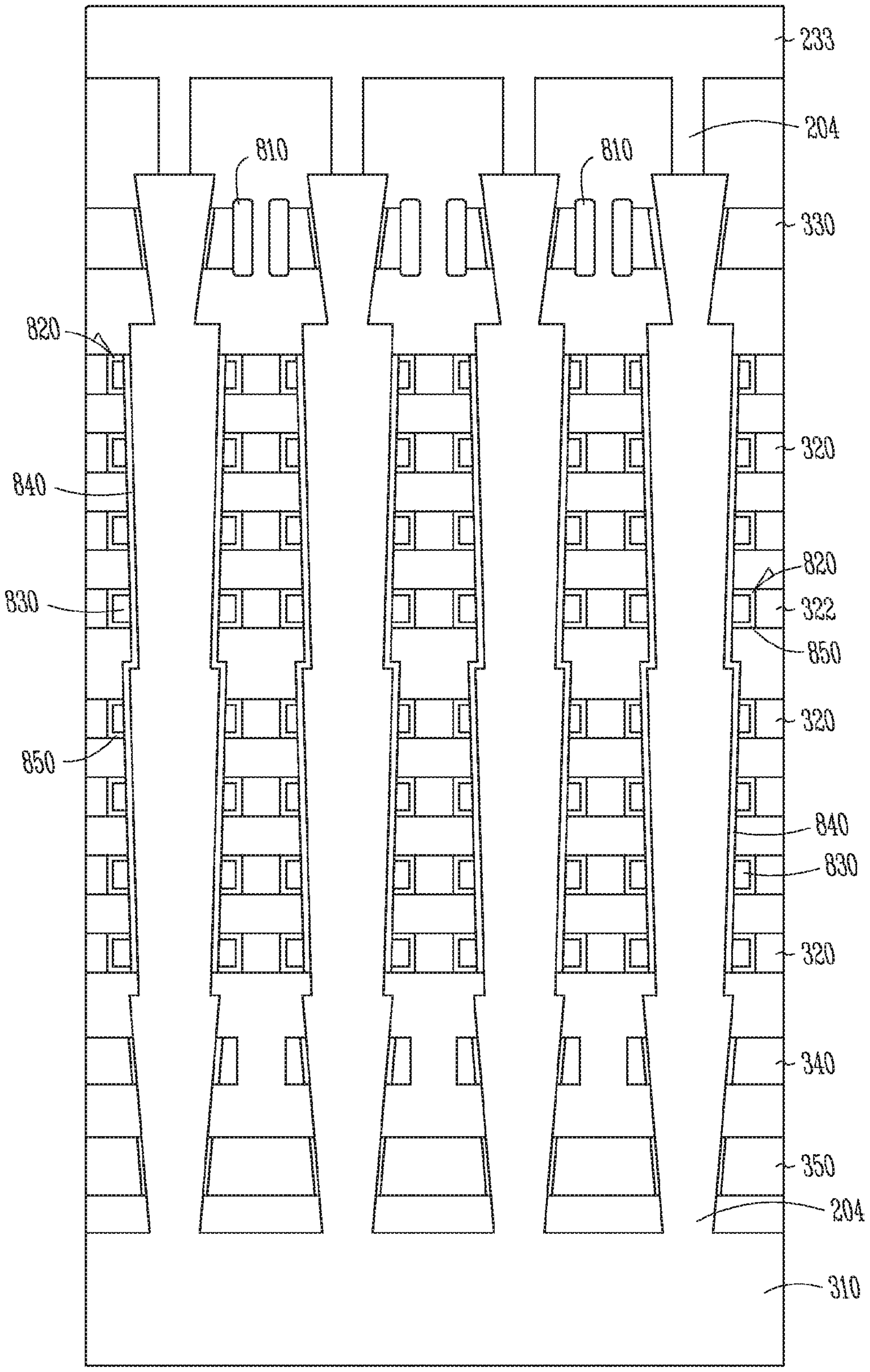
FIG. 8 is a cross-sectional view of a semiconductor construction according to various embodiments of the invention.

FIG. 8 is a cross-sectional view of the semiconductor construction 200 along line 8-8 according to various embodiments of the invention. FIG. 8 illustrates four of the pillars 204 in the block 218 extending from the data line 233 to the p-type silicon well 310 and the tiers including the access lines 320 and 322, the SGDs 330, the SGSs 340 and the source gate 350. Silicon dioxide 810 is formed at edges of the SGDs 330. FIG. 8 illustrates charge storage devices 820 between the access lines 320 and 322 and the pillars 204. Each charge storage device 820 includes a polysilicon storage layer 830 separated from one of the pillars 204 by a tunnel dielectric 840 that can be silicon dioxide. The charge storage layer 830 is separated from the access line 320 or 322 by a blocking dielectric 850 that can include silicon dioxide, silicon nitride ($Si_3N_4$) and silicon dioxide (ONO).

Figure 9:
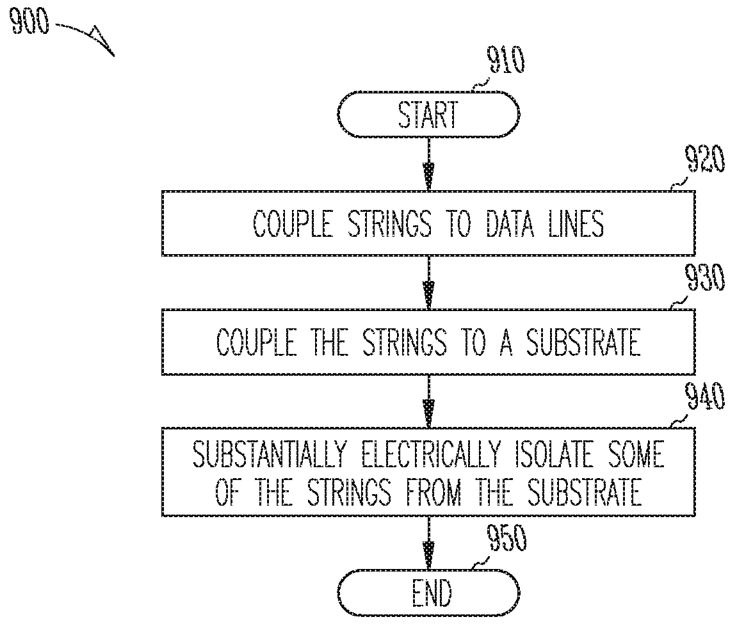
FIG. 9 is a flow diagram of a method according to various embodiments of the invention.

FIG. 9 is a flow diagram of a method 900 according to various embodiments of the invention. In block 910, the method 900 starts. In block 920, strings are coupled to data lines. In block 930, the strings are coupled to a substrate. In block 940, some of the strings are substantially electrically isolated from the substrate. In block 950, the method 900 ends. Various embodiments may have more or fewer activities than those shown in FIG. 9. In some embodiments, the activities may be repeated, and/or performed in serial or parallel fashion. Some embodiments may comprise the same activities in a different order.

Figure 10:
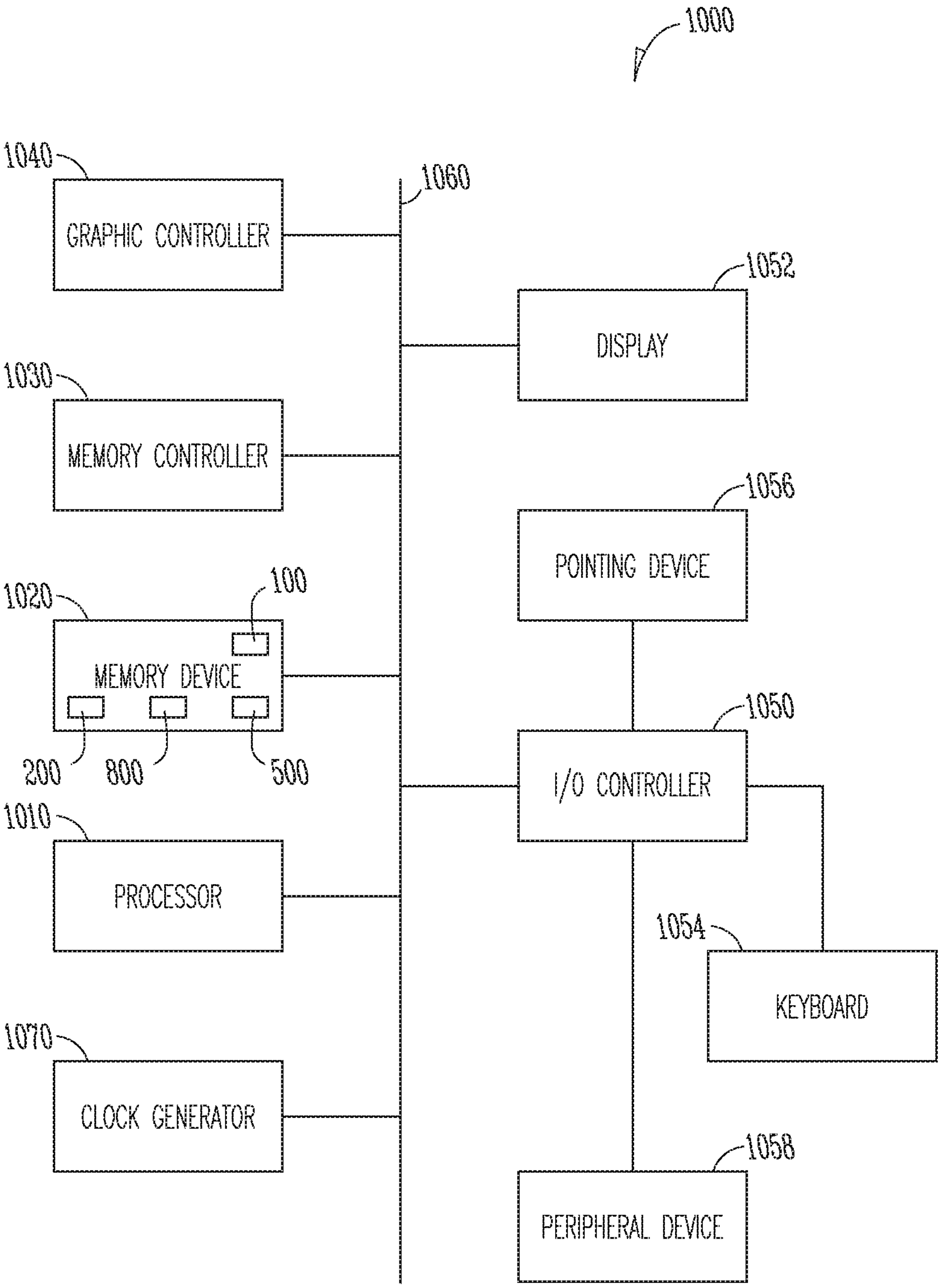
FIG. 10 is a diagram illustrating a system according to various embodiments of the invention.

FIG. 10 is a diagram illustrating a system 1000 according to various embodiments of the invention. The system 1000 may include a processor 1010, a memory device 1020, a memory controller 1030, a graphic controller 1040, an input and output (I/O) controller 1050, a display 1052, a keyboard 1054, a pointing device 1056, and a peripheral device 1058. A bus 1060 couples all of these devices together. A clock generator 1070 is coupled to the bus 1060 to provide a clock signal to at least one of the devices of the system 1000 through the bus 1060. The clock generator 1070 may include an oscillator in a circuit board such as a motherboard. Two or more devices shown in system 1000 may be formed in a single integrated circuit chip. The memory device 1020 may comprise one or more of the block 100 of memory cells described herein and shown in the figures (e.g., see FIGS. 2A and 1B) according to various embodiments of the invention.

The memory device 1020 may comprise one or more of the semiconductor constructions 200, 500 and 800 described herein and shown in the figures according to various embodiments of the invention. The bus 1060 may be interconnect traces on a circuit board or may be one or more cables. The bus 1060 may couple the devices of the system 1000 by wireless means such as by electromagnetic radiations, for example, radio waves. The peripheral device 1058 coupled to the I/O controller 1050 may be a printer, an optical device such as a CD-ROM and a DVD reader and writer, a magnetic device reader and writer such as a floppy disk driver, or an audio device such as a microphone.

The system 1000 represented by FIG. 10 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Charge storage devices in NAND memory devices can be subject to read disturb stress during read operations. The inventors have discovered that the challenges noted above, as well as others, can be addressed with, for example, a source gate device coupled to strings between one or more source select devices and a well in a substrate. Read disturb stress can be substantially reduced by turning off the source select devices in deselected strings during a read operation to substantially electrically isolate the deselected strings from the well in the substrate to substantially prevent conduction between the deselected strings and the well. A conductive member coupled to the substrate can reduce resistance to current flow in the well in the substrate.

Example structures and methods of fabricating semiconductor devices have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising:
- a first string of charge storage devices associated with a pillar comprising semiconductor material;
- a second string of charge storage devices associated with a pillar comprising semiconductor material;
- a first source select device having a gate, the first source select device coupled to the first string of charge storage devices;
- a second source select device having a gate, the second source select device coupled to the second string of charge storage devices, wherein the gates of the first and second source select devices are separated from one another;
- a first source gate device having a gate, the first source gate device coupled between the first source select device and a source; and
- a second source gate device having a gate, the second source gate device coupled between the second source select device and the source, wherein the gates of the first and second source gate devices are coupled to one another to be controlled in common.

2. The apparatus of claim 1, comprising:
- a third string of charge storage devices associated with a pillar comprising semiconductor material;
- a fourth string of charge storage devices associated with a pillar comprising semiconductor material;
- a third source select device having a gate, the third source select device coupled to the third string of charge storage devices;
- a fourth source select device having a gate, the fourth source select device coupled to the fourth string of charge storage devices, wherein the gates of the third and fourth source select devices are separated from each other;
- a third source gate device having a gate, the third source gate device coupled between the third source select device and the source; and
- a fourth source gate device having a gate, the fourth source gate device coupled between the fourth source select device and the source; and wherein the gates of the first, second, third, and fourth source gate devices are coupled to one another to be controlled in common.

3. The apparatus of claim 2, wherein:
- gates of the first and third source select devices are coupled to each other to be controlled in common; and
- gates of the second and fourth source select devices are coupled to each other to be controlled in common.

4. The apparatus of claim 3, further comprising:
- a first drain select device having a gate, the first drain select device coupled to the first string of charge storage device;
- a second drain select device having a gate, the second drain select device coupled to the second string of charge storage devices;
- a third drain select device having a gate, the third drain select device coupled to the third string of charge storage devices; and
- a fourth drain select device having a gate, the fourth drain select device coupled to the fourth string of charge storage devices:
  - wherein gates of the first and second drain select devices are separated from each other,
  - wherein gates of the first and third drain select devices are coupled to each other to be controlled in common, and
  - wherein gates of the second and fourth drain select devices are coupled to each other to be controlled in common.

5. The apparatus of claim 1, wherein the first string of the charge storage devices comprises a floating gate transistor.

6. The apparatus of claim 1, wherein the second string of the charge storage devices comprises a charge trap transistor.

7. The apparatus of claim 1, wherein the pillar extends from a data line to a well in a substrate.

8. The apparatus of claim 1, wherein a distance between two gates of the charge storage devices associated with a pillar is shorter than a distance between the gate of the first source select device and the gate of the first source gate device.

9. The apparatus of claim 1, comprising:
- a first block of memory cells comprising,
- the first string of charge storage devices,
- the second string of charge storage devices,
- the first source select device,
- the second source select device,
- the first source gate device, and
- the second source gate device.

10. The apparatus of claim 9, comprising:
- a second block of memory cells, comprising,
- a third string of charge storage devices associated with a pillar comprising semiconductor material;
- a fourth string of charge storage devices associated with a pillar comprising semiconductor material;

a third source select device having a gate, the third source select device coupled to the third string of charge storage devices;

a fourth source select device having a gate, the fourth source select device coupled to the fourth string of charge storage devices, wherein the gates of the third and fourth source select devices are separated from the gates of the first and second source select devices;

a third source gate device having a gate, the third source gate device coupled between the third source select device and a second source; and a fourth source gate device having a gate, the fourth source gate device coupled between the fourth source select device and the source, wherein the gates of the first, second, third and fourth source gate devices are coupled to each other to be controlled in common.

11. An apparatus, comprising:

multiple strings comprising charge storage devices;

a first unit of source select devices respectively coupled to strings of a first group of strings of the multiple strings to control conduction between the strings of the first group and a source;

a second unit of source select devices respectively coupled to strings of a second group of strings of the multiple strings to control conduction between the strings of the second group and the source, the first group of strings being different from the second group of strings; and a first unit of source gate devices, each respectively coupled in series with a source select device of the first and second units of source select devices, to control conduction between the strings of the first and second groups of strings and the source.

12. The apparatus of claim 11, comprising a first unit of drain select devices, each coupled to a respective string of the first group of strings, to control conduction between the string and a first data line region; and a second unit of drain select devices, each coupled to a respective string of the second group of strings, to control conduction between the string and a second data line region.

13. The apparatus of claim 11, wherein the devices of the third unit of source gate devices are coupled to strings in a block.

14. The apparatus of claim 13, wherein the first unit of source select devices is coupled to strings of a first sub-block and the second unit of source select devices is coupled to strings of a second sub-block.

15. The apparatus of claim 11, wherein a distance between two gates of charge storage devices associated with one string is shorter than a distance between a gate of one source select device associated with the first unit of source select devices and a gate of one source gate device associated with the third unit of source gate devices.

16. The apparatus of claim 11, wherein the charge storage devices comprise floating gate transistors.

17. The apparatus of claim 11, wherein the charge storage devices comprise charge trap transistors.

18. An apparatus comprising:

a memory unit including:

multiple strings of charge storage devices connected by a channel, strings arranged in multiple rows, each string associated with a pillar comprising semiconductor material; and each string in a row including, a source gate device coupled to a source and configured to control conduction between the channel of charge storage devices in the string and the source, wherein a gate of the source gate device is coupled to the gate of another source gate device in the same row of the multiple rows in the memory unit, and also to the gate of a source gate device in another row of the multiple rows in the memory unit; and a source select device coupled between the channel of charge storage devices and the source gate device, the source select device configured to control conduction between the channel and the source.

19. The apparatus of claim 18, wherein the source select device has a gate, and wherein the gate of the source select device is coupled to the gate of another source select device of another string.

20. The apparatus of claim 18, wherein the gates of all source gate devices in a memory block are coupled in common with one another.

* * * * *